United States Patent
Eldridge et al.

(10) Patent No.: US 10,578,649 B2
(45) Date of Patent: Mar. 3, 2020

(54) VERTICAL PROBE ARRAY HAVING A TILED MEMBRANE SPACE TRANSFORMER

(71) Applicant: FormFactor, Inc., Livermore, CA (US)

(72) Inventors: Benjamin N. Eldridge, Danville, CA (US); Masanori Watanabe, Tokyo (JP); Scott Kuhnert, Portland, OR (US); Jeffrey Coussens, Hillsboro, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/116,317

(22) Filed: Aug. 29, 2018

(65) Prior Publication Data

US 2019/0064220 A1 Feb. 28, 2019

Related U.S. Application Data

(60) Provisional application No. 62/552,232, filed on Aug. 30, 2017.

(51) Int. Cl.
*G01R 1/073* (2006.01)

(52) U.S. Cl.
CPC ..... *G01R 1/07378* (2013.01); *G01R 1/07357* (2013.01)

(58) Field of Classification Search
CPC ............ G01R 1/07357; G01R 1/07307; G01R 1/07314
See application file for complete search history.

(56) References Cited

U.S. PATENT DOCUMENTS

| | | | |
|---|---|---|---|
| 5,806,181 A | 9/1998 | Khandros et al. | |
| 6,050,829 A | 4/2000 | Eldridge et al. | |
| 6,259,260 B1* | 7/2001 | Smith | G01R 31/2886 324/756.05 |
| 7,786,743 B2 | 8/2010 | Root | |
| 2010/0085069 A1 | 4/2010 | Smith | |
| 2010/0176832 A1* | 7/2010 | Kister | G01R 1/07314 324/756.07 |
| 2010/0308854 A1 | 12/2010 | Garabedian | |
| 2012/0319711 A1 | 12/2012 | Hung | |
| 2013/0257467 A1* | 10/2013 | Tomioka | G01R 1/0466 324/750.25 |
| 2014/0197860 A1* | 7/2014 | Hsu | G01R 1/07357 324/756.07 |
| 2015/0015289 A1 | 1/2015 | Eldridge | |
| 2015/0280345 A1* | 10/2015 | Kimura | H01R 13/2428 439/700 |
| 2016/0146884 A1 | 5/2016 | Nasu | |
| 2017/0242057 A1* | 8/2017 | Mori | G01R 1/07357 |

* cited by examiner

*Primary Examiner* — Huy Q Phan
*Assistant Examiner* — Adam S Clarke
(74) *Attorney, Agent, or Firm* — Lumen Patent Firm

(57) ABSTRACT

Vertical probe heads having a space transformer laterally tiled into several sections are provided. This change relative to conventional approaches improves manufacturing yield. These probe heads can include metal ground planes, and in embodiments where the ground planes are provided as separate metal plates parallel to the guide plates, the metal plates can also be laterally tiled into several sections. Such tiling of metal plates improves manufacturing yield and alleviates thermal mismatch issues. Probes are not mechanically connected to the space transformer, which facilitates replacement of individual probes of an array.

6 Claims, 3 Drawing Sheets

VERTICAL PROBE ARRAY HAVING A TILED MEMBRANE SPACE TRANSFORMER

CROSS REFERENCE TO RELATED APPLICATIONS

This application claims the benefit of U.S. provisional patent application 62/552,232, filed on Aug. 30, 2017, and hereby incorporated by reference in its entirety.

FIELD OF THE INVENTION

This invention relates to probe heads having vertical probes for testing electronic devices and circuits.

BACKGROUND

Conventional vertical probe assemblies typically include a space transformer and upper and lower guide plates for the probes, where the guide plates and the space transformer are each fabricated as single parts. However, this approach can lead to undesirable levels of thermal stress in response to temperature changes. The fabrication yield of such parts can also be undesirably low.

SUMMARY

In this work, the space transformer and optionally metal ground plane plates are fabricated in several pieces which are tiled onto a carrier to form the complete space transformer (or ground plane plate). This type of probe head can be used for testing of RF integrated circuits where good signal integrity, long lifetime, individual compliance of contacts, and repairability are requirements. Previously, only subsets of these requirements could be satisfied with any one architecture whereas this architecture simultaneously satisfies all of them.

This architecture combines a vertical probe with a tiled membrane space transformer. Some important components (space transformer and, optionally, metal ground plane plates) are manufactured in small pieces and then assembled to the size of the full product. Space transformer membranes and metal ground plane plates have not previously been manufactured this way. For the tiled metal ground plane plates, this also overcomes temperature issues that have otherwise been limiting factors.

Significant advantages are provided. This architecture offers advantages in manufacturing yield for the space transformer membrane and metal ground plane plates and simultaneous satisfaction of several requirements often needed in practice. It also overcomes temperature limitations that would otherwise be present with a guide plate stack comprised of materials with different CTE (coefficient of thermal expansion) values.

DETAILED DESCRIPTION

This work overcomes mechanical limitations of membrane technology and reduces electrical routing complexity of space transformers typically associated with vertical micro-electrical-mechanical (MEMS) probe technology. In preferred embodiments it offers:

a) Good signal integrity (metal ground planes and membrane routing), b) Individually compliant probes (vertical MEMS probe), c) Individually replaceable probes (vertical MEMS probe), d) Standard printed circuit board (PCB) footprints for potentially reusable PCBs (membrane space transformer).

Additionally, the architecture takes traditionally monolithic components and breaks them down into higher yield, lower cost, easier to manufacture pieces that are precision-reassembled for use in the final product. The metal ground plane plates can be tiled in small pieces on to a ceramic carrier, restricting production to pieces that are limited in size. The membrane component can also be produced in small pieces that are tiled on to a glass carrier. For both of these parts, this strategy fits more useful material on a substrate for manufacturing purposes compared with monolithic parts, and increases overall yield as less of a substrate is consumed by non-conforming material when only small pieces are affected.

Traditionally, the membrane space transformer component of a membrane-based probe head has been manufactured as a single, monolithic piece and attached to supporting mechanical parts as a single component. The new strategy used here allows the membrane to be manufactured in smaller strips that are assembled on to supporting mechanical pieces to form a larger piece of membrane. The mechanicals for both strategies can be the same but may differ as well.

Figure 1:
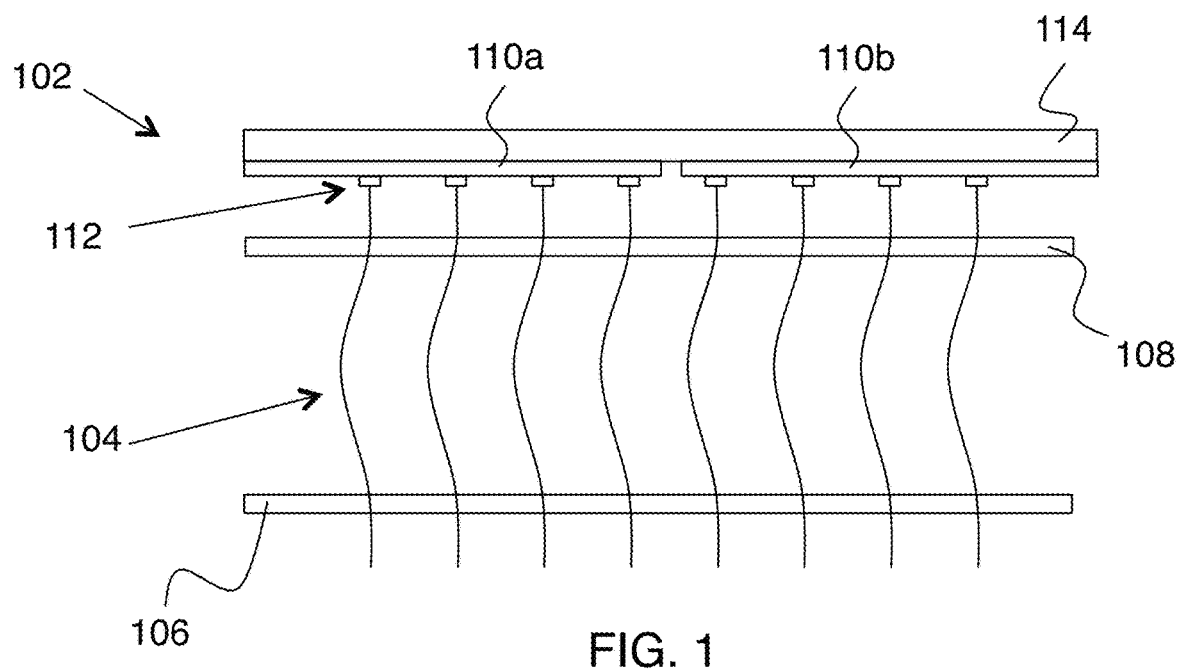
FIG. 1 is a side view of a first embodiment of the invention.

FIG. 1 shows an exemplary embodiment of this approach. Here a probe head 102 includes two or more vertically separated guide plates (106 and 108) and two or more vertical probes 104. Here each of the two or more vertical probes is disposed in a corresponding set of holes in the two or more vertically separated guide plates. In contrast to some other parts of the probe head, the guide plates are fabricated as single parts. This is to ensure that they provide a stable mechanical reference for probe positions in relation to the device under test. The guide plates are preferably fabricated in a mechanically stable, insulating material, such as a ceramic.

Figure 2:
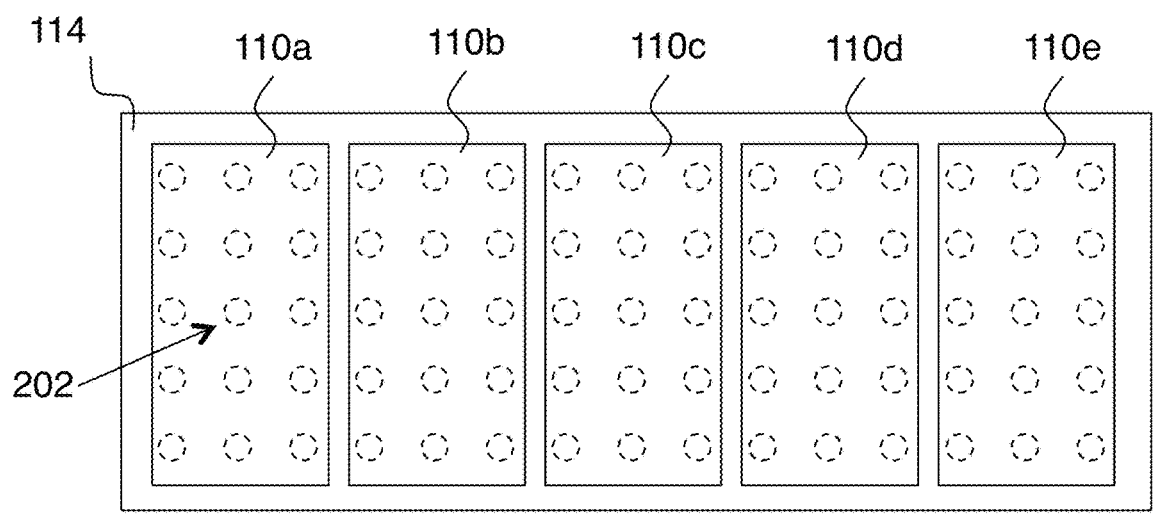
FIG. 2 is a top view of a tiled space transformer relative to one of the guide plates.

A membrane space transformer 110a, 110b is configured to provide electrical contact between the two or more vertical probes and a test instrument (not shown). Each of the two or more vertical probes 104 has a base configured to electrically contact the membrane space transformer (at contacts 112) and a tip configured to electrically contact a device under test. The membrane space transformer is configured as two or more space transformer sections laterally tiled with respect to each other to cover a lateral area of the vertical probe array. Here 110a and 110b are the space transformer sections disposed on substrate 114. FIG. 2 below shows more details relating to this tiling.

For ease of illustration, mechanical parts are shown only schematically in the figures, mainly as substrate 114 for the space transformer. More generally, mechanical parts provide backing to the membrane space transformer and a nonelectrical interface to the PCB. They also provide a frame and spacing to the guide plates and metal ground plane plates (if present).

Electrical and mechanical contact between bases of the vertical probes and the membrane space transformer are non-permanent pressure contacts, as described in more detail below in connection with FIG. 6.

FIG. 2 shows an exemplary top view of tiled space transformer sections. Here 110a, 110b, 110c, 110d, 110e are the space transformer sections tiled onto substrate 114. The hole pattern 202 in guide plate 108 is shown with dashed lines, making it apparent how the space transformer sections are laterally tiled with respect to each other to cover a lateral area of the vertical probe array. Practice of the invention does not depend critically on the details of the space transformer tiling, and any 1-D or 2-D array of space transformer sections that covers the lateral area of the vertical probe array can be employed. The membrane space transformer is used for space transformation from the probe layout to a wider pitch at the PCB. As indicated above, we have found it desirable to make such space transformers in small strips that are tiled to the full probe head size for manufacturing yield reasons.

Figure 3:
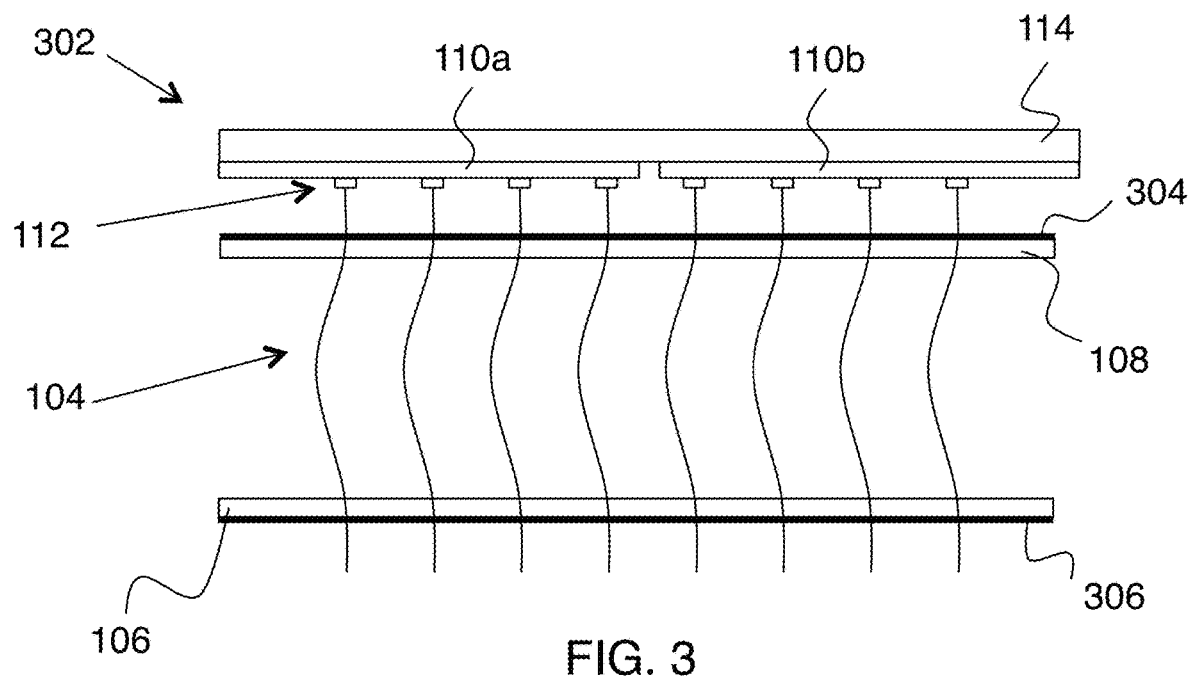
FIG. 3 is a side view of a second embodiment of the invention.
Figure 4:
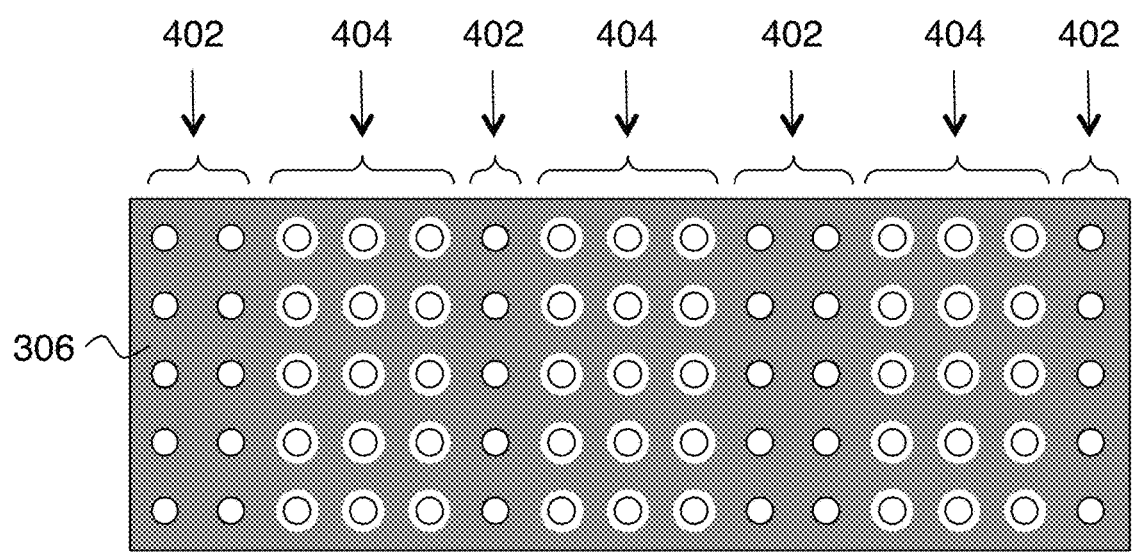
FIG. 4 is a top view of an exemplary metallization pattern of the embodiment of FIG. 3.

In some embodiments it is preferred to provide one or more metal ground planes in the probe head. FIG. 3 shows a first example of such an embodiment. Here probe head 302 is similar to probe head 102 of FIG. 1, except that metal trace 304 is disposed on guide plate 108 and metal trace 306 is disposed on guide plate 106. FIG. 4 shows a bottom view of an exemplary simplified metal trace 306. Here the metal pattern is shown with gray shading, ground probes go though holes 402 in guide plate 106, and signal probes go through holes 404 in guide plate 106. As can be seen in the figure, signal probes pass through holes which are separated from metal trace 306, while ground probes pass through holes that are electrically connected to metal trace 306. Preferably, fabrication of metal trace 306 is performed such that metal trace 306 extends partly or completely down side walls of holes 402 for the ground probes to ensure reliable ground contacts. Since guide plates 106 and 108 are typically fabricated in electrical insulators (e.g. ceramics), the resulting arrangement provides a ground plane electrically connected to the ground probes and electrically insulated from the signal probes.

Figure 5:
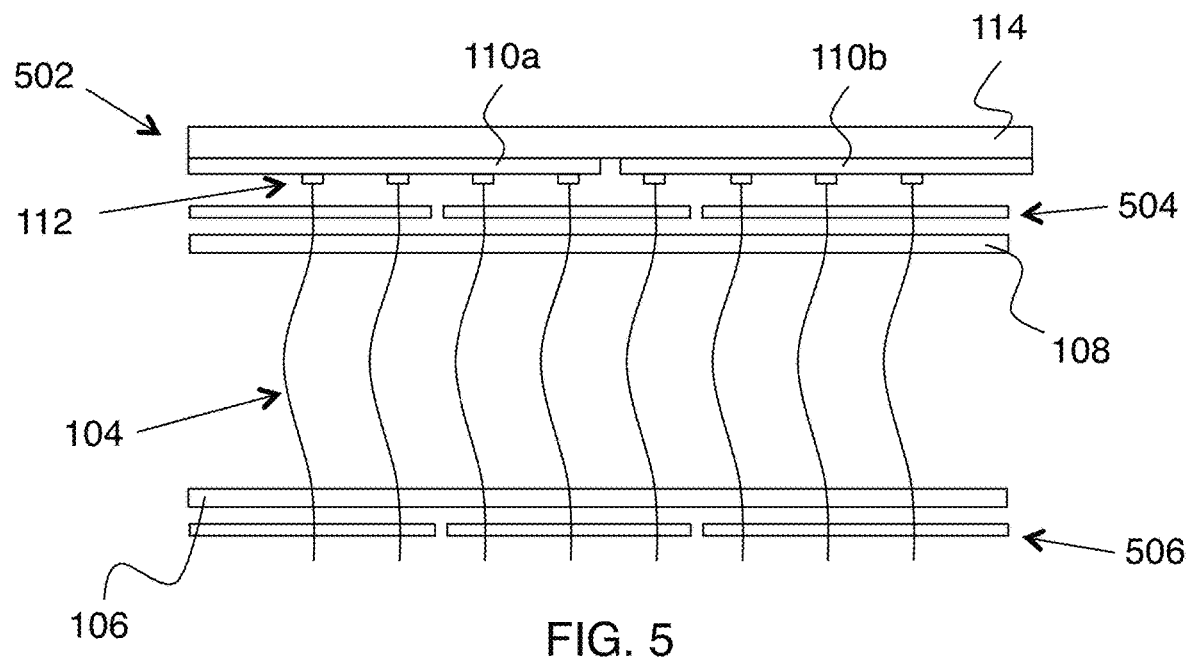
FIG. 5 is a side view of a third embodiment of the invention.

FIG. 5 shows a second example of a ground plane embodiment. Here probe head 502 is similar to probe head 102 of FIG. 1, with the addition of metal plates 504 and 506 disposed parallel to the two or more vertically separated guide plates 106 and 108. Preferably, as shown, the one or more metal plates 504 and 506 are each configured as two or more metal plate sections laterally tiled with respect to each other to cover a lateral area of the vertical probe array. The tiling of these metal plates can have the same pattern as the tiling of the membrane space transformer, or a different pattern than the tiling of the membrane space transformer. Practice of the invention does not depend critically on the details of the tiling of the metal plates, and any 1-D or 2-D array of metal plate sections that covers the lateral area of the vertical probe array can be employed. Practice of the invention also does not depend critically on details of the mechanical supporting arrangement for tiled metal plate sections. In some cases, a ceramic carrier can be used for this purpose. As in the example of FIGS. 3 and 4, it is important to ensure that signal probes do not make electrical contact with the metal plates, and that ground probes do make electrical contact with the metal plates. Techniques for accomplishing this are known in the art. Further details on metal plates in vertical probe heads are given in US 2015/0015289, hereby incorporated by reference in its entirety.

The entire assembly shown here mates the vertical probe array to the membrane space transformer. Vertical probes 104 contact metal pads 112 on the membrane, which in turn routes to an interface to a printed circuit board (not shown). The metal plates 504, 506 are connected to ground and connect all ground probes simultaneously. This forms a ground plane adjacent to the device under test (DUT) for improved signal integrity. Tiling these guide plates also reduces stress due to thermal movement, allowing the probe head to work over a range of temperatures rather than just the assembly temperature. More specifically, tiling of small metal pieces addresses the CTE mismatch between metal and ceramic, where bonding at one temperature and use at an elevated temperature could cause excessive warping or breakage.

Practice of the invention does not depend critically on details of the vertical probes 104. In general, any kind of vertical probe that can perform the basic function of serving as an interconnect between a device or circuit under test and a larger test system can be used. Preferably, as in the example of FIG. 6, the probes are prevented from falling out of the guide plate holes with an integrated mechanical retention feature.

Figure 6:
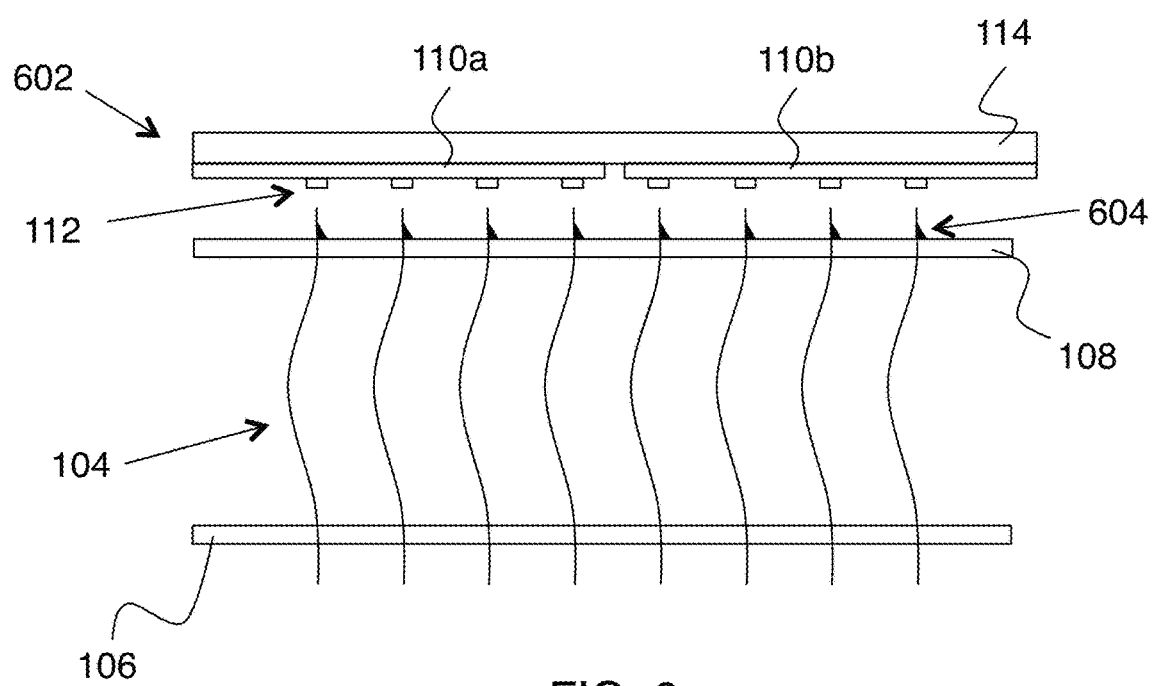
FIG. 6 is a side view of a fourth embodiment of the invention.

FIG. 6 shows a fourth embodiment. Here probe head 602 is similar to probe head 102 of FIG. 1, except that probes 104 are shown spaced apart from contacts 112, and that retention features 604 on probes 104 prevent them from falling downward out of the guide plate holes. In operation, probe head 602 can be held stationary while a device under test is raised into it, which will cause probes 104 to move upward on FIG. 6 with respect to the guide plates and space transformer to make electrical contact with contacts 112 of the space transformer. The resulting probe head does not have a permanent electrical or mechanical connection to the space transformer. Instead, electrical and mechanical contacts between bases of the vertical probes and the membrane space transformer are non-permanent pressure contacts. The same concept of non-permanent pressure contact can be provided during assembly of the probe head, provided the bases of the probes and/or the membrane space transformer have sufficient flexibility to make a pressure contact without permanently deforming the probes.

In either case, the lack of a permanent connection between probes and space transformer means that individual probes in a probe head can be replaced simply by removing the space transformer and picking out the probe(s) to be replaced from the array defined by the guide plates. No breaking and remaking of a mechanical connection between probe and space transformer is needed.

Initial prototypes have been built and tested. Assembly is so far satisfactory-tiled membrane space transformer sections can be aligned to +/−20 um XY positional accuracy, and metal ground plane plates can be tiled to better than +/−5 um radial positional accuracy. Vertical probe heads can be successfully aligned to the membrane space transformer. Probe marks and probe lifetime are equivalent to conventional vertical probe technologies. Continuity has been demonstrated through the assembly from probe tip to the PCB. RF signal integrity is demonstrated past 7 GHz (better than −3 dB insertion loss, better than −10 dB return loss).

The invention claimed is:
1. A vertical probe head comprising:
two or more vertically separated guide plates;

two or more vertical probes, wherein each of the two or more vertical probes is disposed in a corresponding set of holes in the two or more vertically separated guide plates;

a membrane space transformer configured to provide electrical contact between the two or more vertical probes and a test instrument;

wherein each of the two or more vertical probes has a base configured to electrically contact the membrane space transformer and a tip configured to electrically contact a device under test;

wherein the membrane space transformer is configured as two or more space transformer sections laterally tiled with respect to each other to cover a lateral area of the vertical probe array;

wherein the space transformer sections are configured to make contact with the bases of the vertical probes in a contact pattern that directly corresponds to a pattern of the vertical probes;

wherein electrical and mechanical contact between bases of the vertical probes and the membrane space transformer is a non-permanent pressure contact.

2. The vertical probe head of claim 1, further comprising one or more metal ground planes.

3. The vertical probe head of claim 2, wherein the one or more metal ground planes are configured as metal traces disposed on at least one of the two or more vertically separated guide plates.

4. The vertical probe head of claim 2, wherein the one or more metal ground planes are configured as one or more metal plates disposed parallel to the two or more vertically separated guide plates.

5. The vertical probe head of claim 4, wherein the one or more metal plates are each configured as two or more metal plate sections laterally tiled with respect to each other to cover a lateral area of the vertical probe array.

6. The vertical probe head of claim 1, wherein one or more selected probes of the two or more vertical probes can be replaced without breaking or remaking a mechanical connection between the selected probes and the membrane space transformer.

* * * * *